(12) United States Patent
Drizlikh et al.

(10) Patent No.: US 7,229,908 B1
(45) Date of Patent: Jun. 12, 2007

(54) SYSTEM AND METHOD FOR MANUFACTURING AN OUT OF PLANE INTEGRATED CIRCUIT INDUCTOR

(75) Inventors: Sergei Drizlikh, Scarborough, ME (US); Todd Thibeault, Limington, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 83 days.

(21) Appl. No.: 10/861,563

(22) Filed: Jun. 4, 2004

(51) Int. Cl.
*H01L 21/4763* (2006.01)
*H01L 21/44* (2006.01)

(52) U.S. Cl. .................. 438/622; 438/623; 438/618; 438/672; 257/E21.022

(58) Field of Classification Search .......... None
See application file for complete search history.

(56) References Cited

U.S. PATENT DOCUMENTS

| | | | |
|---|---|---|---|
| 3,290,758 A * | 12/1966 | Moyer ........................ 438/3 |
| 3,614,554 A * | 10/1971 | Richardson et al. ........ 257/531 |
| 3,858,138 A * | 12/1974 | Gittleman et al. .......... 336/136 |
| 5,070,317 A | 12/1991 | Bhagat |
| 5,372,967 A * | 12/1994 | Sundaram et al. .......... 438/381 |
| 5,610,569 A * | 3/1997 | Hwang et al. .............. 336/200 |
| 6,008,102 A | 12/1999 | Alford et al. |
| 6,103,405 A | 8/2000 | Tomita |
| 6,236,538 B1 * | 5/2001 | Yamada et al. ............. 360/126 |
| 6,249,039 B1 | 6/2001 | Harvey et al. |
| 6,377,156 B2 | 4/2002 | Farrar et al. |
| 6,417,039 B2 * | 7/2002 | Webster ...................... 438/238 |
| 6,445,271 B1 | 9/2002 | Johnson |
| 6,535,098 B1 * | 3/2003 | Yeo et al. ................... 336/200 |
| 6,541,841 B2 | 4/2003 | Maeda et al. |
| 6,595,787 B2 | 7/2003 | Fork et al. |
| 6,614,093 B2 | 9/2003 | Ott et al. |
| 6,635,949 B2 | 10/2003 | Lowther et al. |
| 6,646,533 B2 | 11/2003 | Biegelson et al. |
| 6,646,534 B2 | 11/2003 | Ahn et al. |
| 6,803,848 B2 * | 10/2004 | Yeo et al. ................... 336/200 |
| 6,819,527 B1 * | 11/2004 | Dill et al. ................... 360/123 |
| 7,033,880 B2 * | 4/2006 | Rhee .......................... 438/238 |

OTHER PUBLICATIONS

Chua, Christopher L., et al, "Out-of-Plane High-Q Inductors on Low-Resistance Silicon," Journal of Microelectromechanical Systems, vol. 12, No. 6, Dec. 2003, pp. 989-995.
Carchon, G., et al., "Wafer-Level Packaging Technology for Extended Global Wiring and Inductors," IEEE, 2003, pp. 103-106.

* cited by examiner

Primary Examiner—Scott B. Geyer (57) ABSTRACT

A system and method is described for manufacturing an out of plane integrated circuit inductor. A plurality of parallel metal bars are formed on a substrate and covered with a first passivation layer. A ferromagnetic core is then deposited over the first passivation layer with its length perpendicular to the plurality of parallel metal bars. A second passivation layer is deposited over the ferromagnetic core and vias are etched through the passivation layers to the alternate ends of the underlying parallel metal bars. A plurality of cross connection metal bars are then formed on the second passivation layer with vertical portions that fill the vias and connect the alternate ends of the plurality of parallel metal bars to form an inductor coil. A third passivation layer is then deposited over the cross connection metal bars.

20 Claims, 6 Drawing Sheets

SYSTEM AND METHOD FOR MANUFACTURING AN OUT OF PLANE INTEGRATED CIRCUIT INDUCTOR

TECHNICAL FIELD OF THE INVENTION

The present invention is generally directed to manufacturing technology for semiconductor devices and, in particular, to a system and method for manufacturing an out of plane integrated circuit inductor.

BACKGROUND OF THE INVENTION

Some types of prior art integrated circuit inductors have coils that lie in a plane that is parallel to the plane of an underlying substrate. The axis of the coils in these "in plane" inductors is perpendicular to the plane of the underlying substrate. This arrangement causes most of the magnetic flux of the inductor to penetrate into the substrate. Magnetic flux in the substrate induces lossy eddy currents and degrades the quality factor (Q) of the inductor.

To solve this problem various types of prior art "out of plane" integrated circuit inductors have been developed. One type of prior art "out of plane" inductor comprises three dimensional micro-coils that are fabricated on a planar substrate. The three dimensional micro-coils are micro-machined using micro-electromechanical systems (MEMS) technology. The micro-coils form an "out of plane" solenoid that has its longitudinal axis parallel to the surface of an underlying substrate. This arrangement causes less magnetic flux to enter the substrate and cause fewer eddy currents.

Other types of out of plane inductors have been designed in which the elements that make up the coils of the inductor are fabricated within the layers of an integrated circuit. The elements are connected to form a three dimensional out of plane coil within the integrated circuit.

The prior art methods for forming these types of out of plane inductors have significant drawbacks. The prior art methods tend to be relatively expensive, require numerous and complex manufacturing steps, and have questionable controllability. In addition, some of the prior art manufacturing methods require considerable time to perform.

Therefore, there is a need in the art for an improved system and method for manufacturing an out of plane integrated circuit inductor. There is a need in the art for an inexpensive, simple, and reliable system and method for manufacturing an out of plane integrated circuit inductor.

SUMMARY OF THE INVENTION

To address the above-discussed deficiencies of the prior art, it is a primary object of the present invention to provide a system and method for manufacturing an out of plane integrated circuit inductor.

To manufacture an out of plane integrated circuit inductor in accordance with the principles of the present invention a plurality of parallel metal bars are formed on a substrate or other suitable surface of an integrated circuit. In one embodiment of the invention the plurality of parallel metal bars are made of copper. The plurality of parallel metal bars is then covered with a first passivation layer. In one embodiment of the invention the first passivation layer is made of benzo-cyclobutene (BCB).

Then a ferromagnetic core is deposited over the first passivation layer. The length of the ferromagnetic core is perpendicular to the length of the plurality of parallel metal bars. In one embodiment of the invention the ferromagnetic core is made of nickel. Then a second passivation layer is deposited over the ferromagnetic core and the first passivation layer.

Vias are then etched through the second passivation layer and through the first passivation layer to the alternate ends of the underlying parallel metal bars. Then a plurality of cross connection metal bars are formed on the second passivation layer with vertical portions that fill the vias and connect the alternate ends of the plurality of parallel metal bars to form an inductor coil. A third passivation layer is then deposited over the cross connection metal bars and the second passivation layer. This forms an inductor coil within the integrated circuit.

It is an object of the present invention to provide a system and method for manufacturing an out of plane integrated circuit inductor.

It is also an object of the present invention to provide a system and method for manufacturing a relatively inexpensive and simple out of plane integrated circuit inductor.

It is yet another object of the present invention to provide a system and method for manufacturing a reliable out of plane integrated circuit inductor that requires a minimum of manufacturing steps.

It is still another object of the present invention to provide a system and method for manufacturing an out of plane integrated circuit inductor that has a ferromagnetic core located within the coils of the integrated circuit inductor.

It is another object of the present invention to provide a system and method for manufacturing an out of plane integrated circuit inductor that does not have a ferromagnetic core.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 17, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged integrated circuit.

To simplify the drawings the reference numerals from previous drawings may sometimes not be repeated for structures that have already been identified.

An advantageous embodiment of the inductor coil of the present invention will be described that comprises a plurality of parallel metal bars formed on a substrate. It is understood that the location of the plurality of parallel metal bars on an underlying substrate is merely an example and that the plurality of parallel metal bars may be part of any suitable metal layer of an integrated circuit. That is, in an alternate embodiment of the invention the substrate may comprise a portion of an integrated circuit that contains circuit elements.

Figure 1:
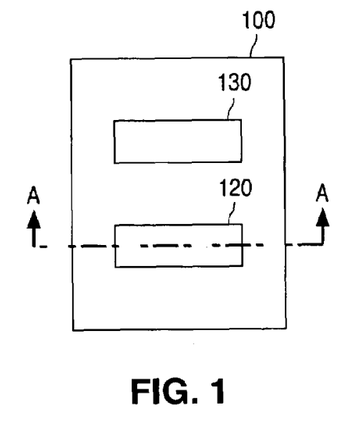
FIG. 1 illustrates a plan view of two parallel metal bars placed on a substrate in accordance with an advantageous embodiment of the invention.

The manufacture of a single turn of the inductor coil of the invention will now be described. FIG. 1 illustrates a plan view of a first metal bar 120 and a second metal bar 130 placed on a substrate 100 in accordance with an advantageous embodiment of the invention. Metal bar 120 and metal bar 130 are deposited and patterned using conventional integrated circuit manufacturing techniques. Metal bar 120 and metal bar 130 are constructed so that they are parallel to each other. The metal in metal bar 120 and in metal bar 130 may comprise copper, aluminum, or any other similar metal that is a good conductor of electricity. For example, if metal bar 120 and metal bar 130 are made of copper, then copper seed lines (not shown) may be deposited and patterned on the substrate 100. Then the main portion of the copper of metal bar 120 and of metal bar 130 may be deposited using semi-additive electroplating.

Figure 2:
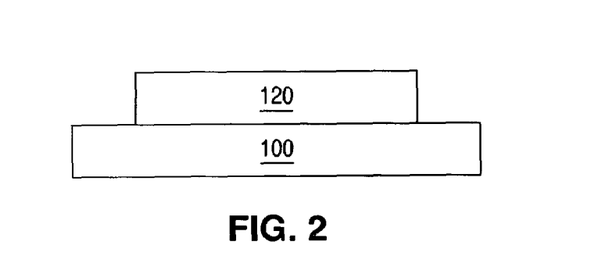
FIG. 2 illustrates a cross sectional view of the structure shown in FIG. 1 taken along line A—A.

FIG. 2 illustrates a cross sectional view of the structure shown in FIG. 1 taken along line A—A. FIG. 2 illustrates the lateral position of metal bar 120 with respect to the underlying substrate 100.

Figure 3:
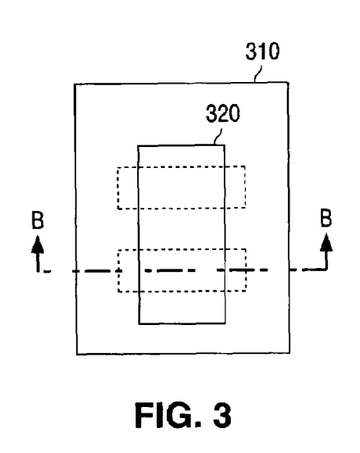
FIG. 3 illustrates a plan view of a ferromagnetic core placed over a first passivation layer placed over the two parallel metal bars on the substrate.

FIG. 3 illustrates a plan view of a ferromagnetic core 320 placed over a first passivation layer 310 placed over metal bar 120 and metal bar 130 on substrate 100. Metal bar 120 and metal bar 130 are shown in dotted outline in FIG. 3 because they are covered with first passivation layer 310.

The structure shown in FIG. 3 is constructed as follows. A first passivation layer 310 is deposited over metal bar 120 and over metal bar 130 and over substrate 100. The first passivation layer 310 is then planarized. In one advantageous embodiment the material of passivation layer 310 comprises benzo-cyclobutene (BCB). A significant advantage of BCB (or other similar polyimid material) is that it is self planarizing. That is, the BCB is spun as a resist and then cured. This creates a planarized first passivation layer 310. In one advantageous embodiment the thickness of the first passivation layer 310 is chosen to be approximately one half of the intended final thickness of the inductor coil. The deposition and planarization of the first passivation layer 310 are accomplished using conventional integrated circuit manufacturing techniques.

Then a ferromagnetic core 320 is deposited and patterned over the first passivation layer 310 using conventional integrated circuit manufacturing techniques. The ferromagnetic core 320 is constructed so that its length is perpendicular to metal bar 120 and metal bar 130. In one advantageous embodiment of the invention the metal in the ferromagnetic core is nickel. A nickel seed line (not shown) may be deposited and patterned on the first passivation layer 310. Then the main portion of the nickel of the ferromagnetic core 320 may be deposited using semi-additive electroplating.

Figure 4:
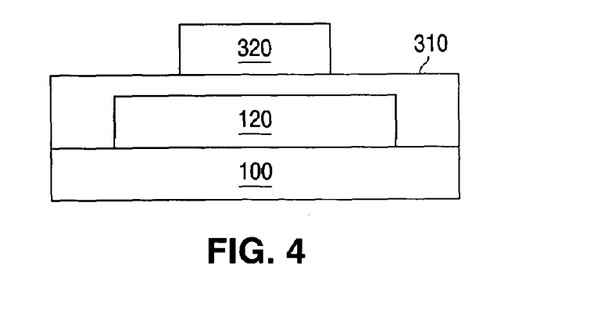
FIG. 4 illustrates a cross sectional view of the structure shown in FIG. 3 taken along line B—B.

FIG. 4 illustrates a cross sectional view of the structure shown in FIG. 3 taken along line B—B. FIG. 4 illustrates the position of the ferromagnetic core 320 with respect to the underlying metal bar 120.

Figure 5:
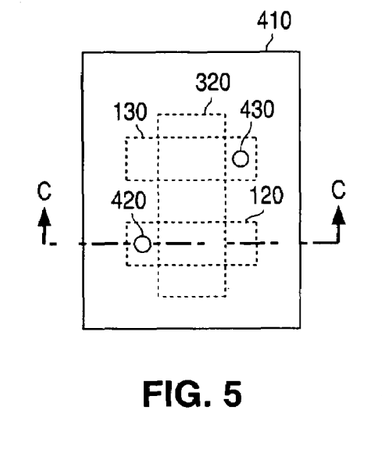
FIG. 5 illustrates a plan view of a second passivation layer placed over the ferromagnetic core shown in FIG. 3 and in FIG. 4 and vias that are etched through the second passivation layer and through the first passivation layer down to the underlying two parallel metal bars on the substrate.

FIG. 5 illustrates a plan view of a second passivation layer 410 placed over the ferromagnetic core 320. The ferromagnetic core 320 is shown in dotted outline in FIG. 5 because it is covered with second passivation layer 410. FIG. 5 also illustrates vias 420, 430 that have been etched through the second passivation layer 420 and through the first passivation layer 310 down to the underlying metal bar 120 and down to the underlying metal bar 130.

The structure shown in FIG. 5 is constructed as follows. A second passivation layer 410 is deposited over the ferromagnetic core 320 and the first passivation layer 310. The second passivation layer 410 is then planarized. In one advantageous embodiment the material of passivation layer 410 comprises benzo-cyclobutene (BCB). A significant advantage of BCB (or other similar polyimid material) is that it is self planarizing. That is, the BCB is spun as a resist and then cured. This creates a planarized second passivation layer 410. The deposition and planarization of the second passivation layer 410 are accomplished using conventional integrated circuit manufacturing techniques.

Then vias 420, 430 are etched through the second passivation layer 410 and through the first passivation layer 310 using conventional integrated circuit manufacturing techniques. Via 420 extends down to the underlying metal bar 120 on substrate 100. Via 430 extends down to the underlying metal bar 130 on substrate 100. As shown in FIG. 5, via 420 is etched down to the left end of metal bar 120. Via 430 is etched down to the right end of metal bar 130. This means that via 420 and via 430 are located on alternate ends of the two adjacent parallel metal bars 120 and 130. The location of via 420 on the left end of metal bar 120 and the location of via 430 on the right end of metal bar 130 establishes the locations for the ends of a cross connection metal bar that will be added at a later stage of the manufacturing process to complete one turn of the inductor coil of the invention.

Figure 6:
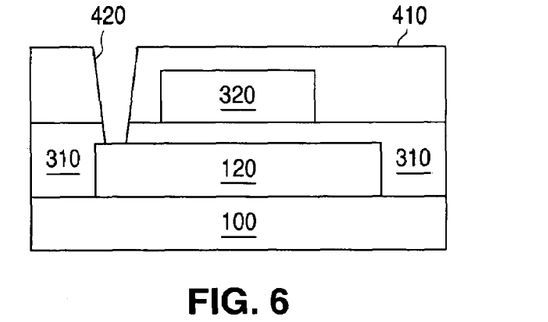
FIG. 6 illustrates a cross sectional view of the structure shown in FIG. 5 taken along line C—C.

FIG. 6 illustrates a cross sectional view of the structure shown in FIG. 5 taken along line C—C. FIG. 6 illustrates the position of via 420 through the second passivation layer 410 and through the first passivation layer 310 down to the left end of metal bar 120.

Figure 7:
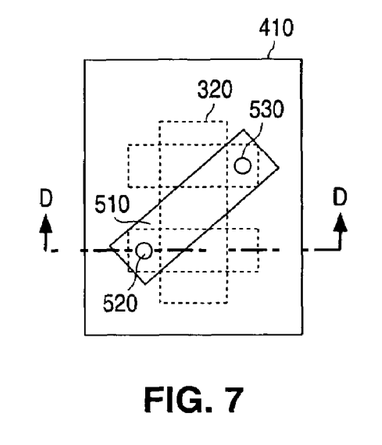
FIG. 7 illustrates a plan view of a cross connection metal bar placed over the second passivation layer wherein the cross connection metal bar has vertical portions that fill the vias and electrically connect the two underlying parallel metal bars on the substrate.

FIG. 7 illustrates a plan view of a cross connection metal bar 510 placed over the second passivation layer 410. Cross connection metal bar 510 extends from via 420 to via 430. Cross connection metal bar 510 comprises a first vertical portion 520 that fills via 420 and a second vertical portion 530 that fills via 430. In this manner the alternate ends of the two underlying parallel metal bars 120 and 130 on substrate 100 are electrically connected by cross connection metal bar 510.

The cross connection metal bar 510 is deposited and patterned using conventional integrated circuit manufacturing techniques. The metal in the cross connection metal bar 510 may comprise copper, aluminum, or any other similar metal that is a good conductor of electricity. For example, if the cross connection metal bar 510 is made of copper, then a copper seed line (not shown) may be deposited and patterned on the second passivation layer 410 (including the surface of via 420 and the surface of via 430). Then the main portion of the copper of the cross connection metal bar 510 may be deposited using semi-additive electroplating. The copper portion that fills via 420 is the vertical portion 520 of the cross connection metal bar 510. The copper portion that fills via 430 is the vertical portion 530 of the cross connection metal bar 510.

Figure 8:
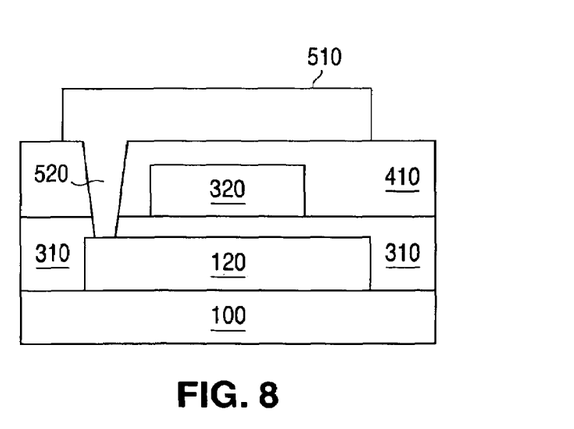
FIG. 8 illustrates a cross sectional view of the structure shown in FIG. 7 taken along line D—D.

FIG. 8 illustrates a cross sectional view of the structure shown in FIG. 7 taken along line D—D. FIG. 8 illustrates how via 420 is filled with vertical portion 520 of cross connection metal bar 510.

Figure 9:
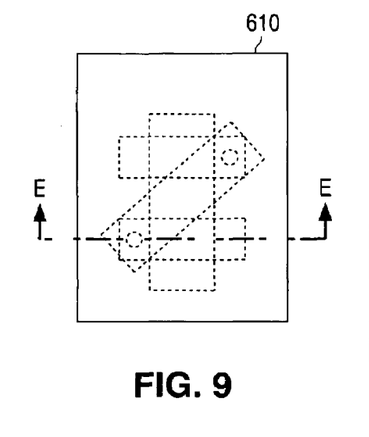
FIG. 9 illustrates a plan view of a third passivation layer placed over the cross connection metal bar shown in FIG. 7 and in FIG. 8.

FIG. 9 illustrates a plan view of a third passivation layer 610 placed over the cross connection metal bar 510 shown in FIG. 7 and in FIG. 8. The cross connection metal bar 510 is shown in dotted outline in FIG. 9 because it is covered with third passivation layer 610.

The structure shown in FIG. 9 is constructed as follows. A third passivation layer 610 is deposited over the cross connection metal bar 510 and the second passivation layer 410. The third passivation layer 610 is then planarized. In one advantageous embodiment the material of passivation layer 610 comprises benzo-cyclobutene (BCB). A significant advantage of BCB (or other similar polyimid material) is that it is self planarizing. That is, the BCB is spun as a resist and then cured. This creates a planarized third passivation layer 610. The deposition and planarization of the third passivation layer 610 are accomplished using conventional integrated circuit manufacturing techniques.

Figure 10:
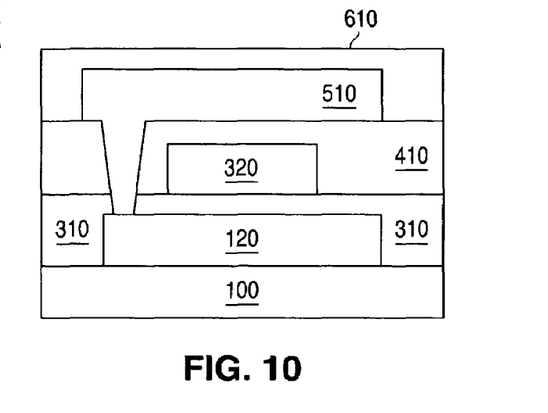
FIG. 10 illustrates a cross sectional view of the structure shown in FIG. 9 taken along line E—E.

FIG. 10 illustrates a cross sectional view of the structure shown in FIG. 9 taken along line E—E. FIG. 10 illustrates how the third passivation layer 610 covers the cross connection metal bar 510 and the second passivation layer 410.

The manufacturing steps described above produce a single turn of the inductor coil of the present invention. Electrical current that flows in metal bar 120 may flow up through a vertical portion 520 of cross connection metal bar 510 in via 420, across the body of cross connection metal bar 510, and then down through vertical portion 530 of cross connection metal bar 510 in via 430 to metal bar 130. In this manner electrical current may flow in an out of plane loop from a first metal bar 120 to a second metal bar 130 where the second metal bar 130 is located adjacent to and parallel with the first metal bar 120. It is understood that the direction of current flow may also be in the opposite direction (i.e., from the second metal bar 130 to the first metal bar 120).

The advantageous embodiment that has been described comprises a structure in which the metal bar 120 and the metal bar 130 are located on one side of ferromagnetic core 320 and the cross connection metal bar 510 is located on the other side of ferromagnetic core 320. It is understood that an alternate advantageous embodiment of the invention may be constructed in which the ferromagnetic core 320 is absent. To create the alternate advantageous embodiment the step of depositing the ferromagnetic core 320 is omitted. The structure of such an alternate advantageous embodiment of the invention is shown in FIG. 11 and in FIG. 12.

Figure 11:
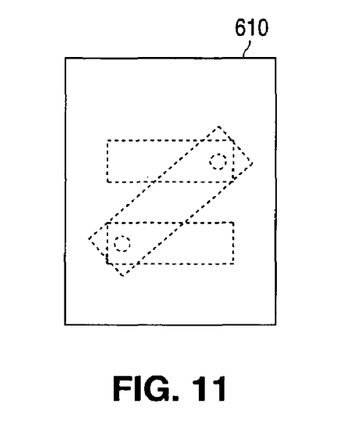
FIG. 11 illustrates the structure shown in FIG. 9 without a ferromagnetic core.

FIG. 11 illustrates a plan view of a single turn of the inductor coil of the invention without ferromagnetic core 320. That is, FIG. 11 illustrates the structure as shown in FIG. 9 in which ferromagnetic core 320 is absent.

Figure 12:
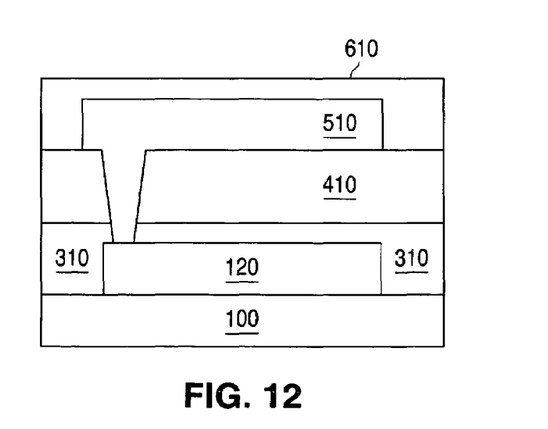
FIG. 12 illustrates the structure shown in FIG. 10 without a ferromagnetic core.

FIG. 12 illustrates a cross section of a single turn of the inductor coil of the invention without ferromagnetic core 320. That is, FIG. 12 illustrates the structure as shown in FIG. 10 in which ferromagnetic core 320 is absent.

Figure 13:
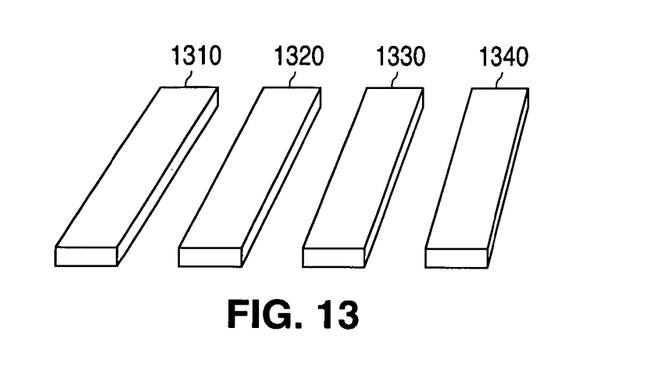
FIG. 13 illustrates a perspective view of a plurality of parallel metal bars.

The construction of a single turn of the out of plane inductor coil of the present invention has been described. In order to add additional turns to the inductor coil additional metal bars and additional cross connection metal bars must be created. For example, consider the construction of an inductor coil having three turns. FIG. 13 illustrates a perspective view of a plurality of parallel metal bars. In this case the plurality of parallel metal bars is made up of four such bars. The four bars are designated with reference numerals 1310, 1320, 1330 and 1340. For clarity of illustration the underlying substrate and surrounding passivation layers are not shown.

Figure 14:
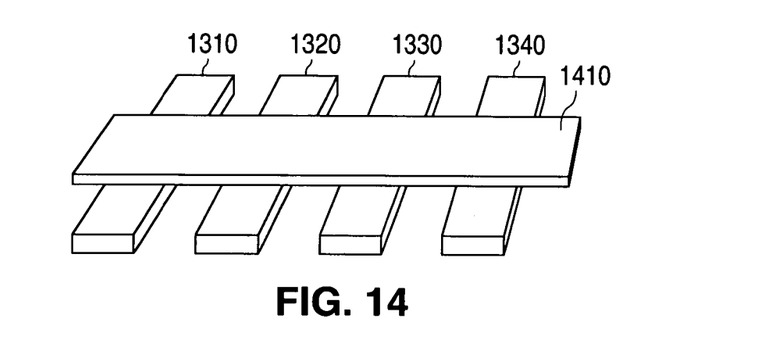
FIG. 14 illustrates a perspective view of a ferromagnetic core placed over the plurality of parallel metal bars shown in FIG. 13.

Then a ferromagnetic core is manufactured having a length that is perpendicular to the underlying parallel metal bars. FIG. 14 illustrates a perspective view of a ferromagnetic core 1410 created over the parallel metal bars 1310, 1320, 1330 and 1340. Ferromagnetic core 1410 is created using the methods that have been previously described. For clarity of illustration the underlying substrate and the surrounding passivation layers are not shown in FIG. 14.

Figure 15:
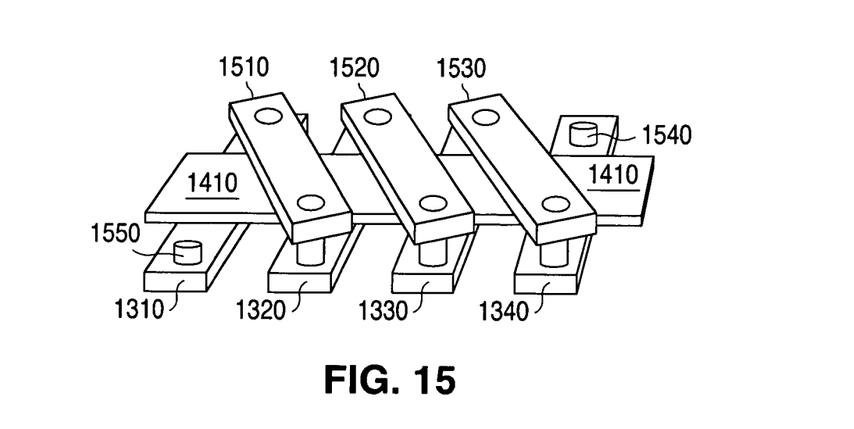
FIG. 15 illustrates a perspective view of a plurality of cross connecting metal bars have ends connected to alternate ends of the plurality of metal bars that form an inductor coil that encloses the ferromagnetic core shown in FIG. 14.

Then a plurality of cross connection metal bars is created to connect the alternate ends of the parallel metal bars 1310, 1320, 1330 and 1340. As previously described each cross connection metal bar comprises vertical portions for filling the vias that are etched in the passivation layers. FIG. 15 illustrates a perspective view of a plurality of cross connection metal bars. In this case the plurality of cross connection metal bars comprises three such bars designated with reference numerals 1510, 1520 and 1530. The cross connection metal bars 1510, 1520 and 1530 have ends that are connected to alternate ends of the plurality of metal bars 1310, 1320, 1330 and 1340 that enclose the ferromagnetic core 1410.

The connection of the metal bars 1310, 1320, 1330 and 1340 to the cross connection metal bars 1510, 1520 and 1530 form an out of plane inductor coil having three turns. A metal contact 1540 is manufactured on one end of metal bar 1340 for connecting one end of the inductor coil. A metal contact 1550 is manufactured on one end of metal bar 1310 for connecting the other end of the inductor coil. As before, for clarity of illustration the underlying substrate and the surrounding passivation layers are not shown in FIG. 15.

Figure 16:
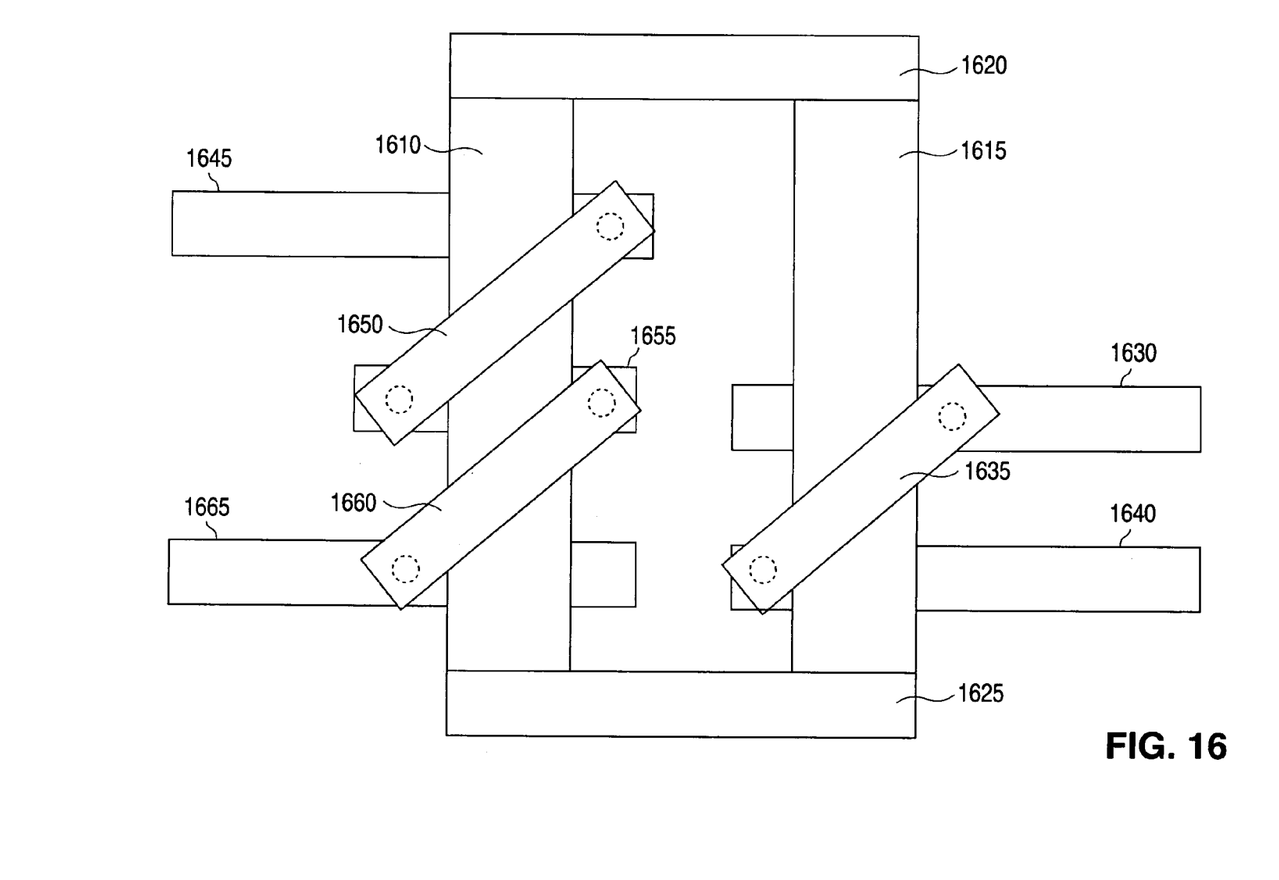
FIG. 16 illustrates a plan view of an advantageous embodiment of the invention used in a transformer circuit.

FIG. 16 illustrates a plan view of an advantageous embodiment of the invention used in a transformer circuit. A transformer circuit comprises a core that forms a closed magnetic circuit. A primary winding is coiled around one side of the core and a secondary winding is coiled around the opposite side of the core. An alternating voltage is applied to the primary winding and generates an alternating magnetic flux in the core. The alternating magnetic flux links through the secondary winding and induces an alternating electromotive force (EMF) in the secondary winding.

The core of the transformer shown in FIG. 16 comprises metal bar 1610, metal bar 1615, metal end piece 1620 and metal end piece 1625. Metal end piece 1610 is electrically connected to the top ends of metal bar 1610 and metal bar 1615. Metal end piece 1625 is electrically connected to the bottom ends of metal bar 1610 and metal bar 1615. Metal bar 1610, metal end piece 1620, metal bar 1615, and metal end piece 1625 form a core that provides a closed magnetic circuit.

In the advantageous embodiment of the invention shown in FIG. 16 the primary winding of the transformer comprises an out of plane inductor coil that has two turns. The underlying metal bars in the primary winding comprise metal bar 1645, metal bar 1655, and metal bar 1665. Metal bar 1610 is formed so that its length is perpendicular to the underlying metal bars. Metal bar 1610 forms the ferromagnetic core within the primary winding inductor coil of the invention. The cross connection metal bars in the primary winding comprise cross connection metal bar 1650 and cross connection metal bar 1660. The vias that connect the underlying metal bars 1645, 1655, and 1665 to the cross connection metal bars 1650 and 1660 are shown in dotted outline. For clarity of illustration the underlying substrate and the surrounding passivation layers of the primary winding are not shown in FIG. 16.

The secondary winding of the transformer comprises an out of plane inductor coil that has one turn. The underlying metal bars in the secondary winding comprise metal bar 1630 and metal bar 1640. Metal bar 1615 is formed so that its length is perpendicular to the underlying metal bars. Metal bar 1615 forms the ferromagnetic core within the secondary winding inductor coil of the invention. The cross connection metal bar in the secondary winding is cross connection metal bar 1635. The vias that connect the underlying metal bars 1630 and 1640 to the cross connection metal bar 1635 are shown in dotted outline. For clarity of illustration the underlying substrate and the surrounding passivation layers of the secondary winding are not shown in FIG. 16.

Figure 17:
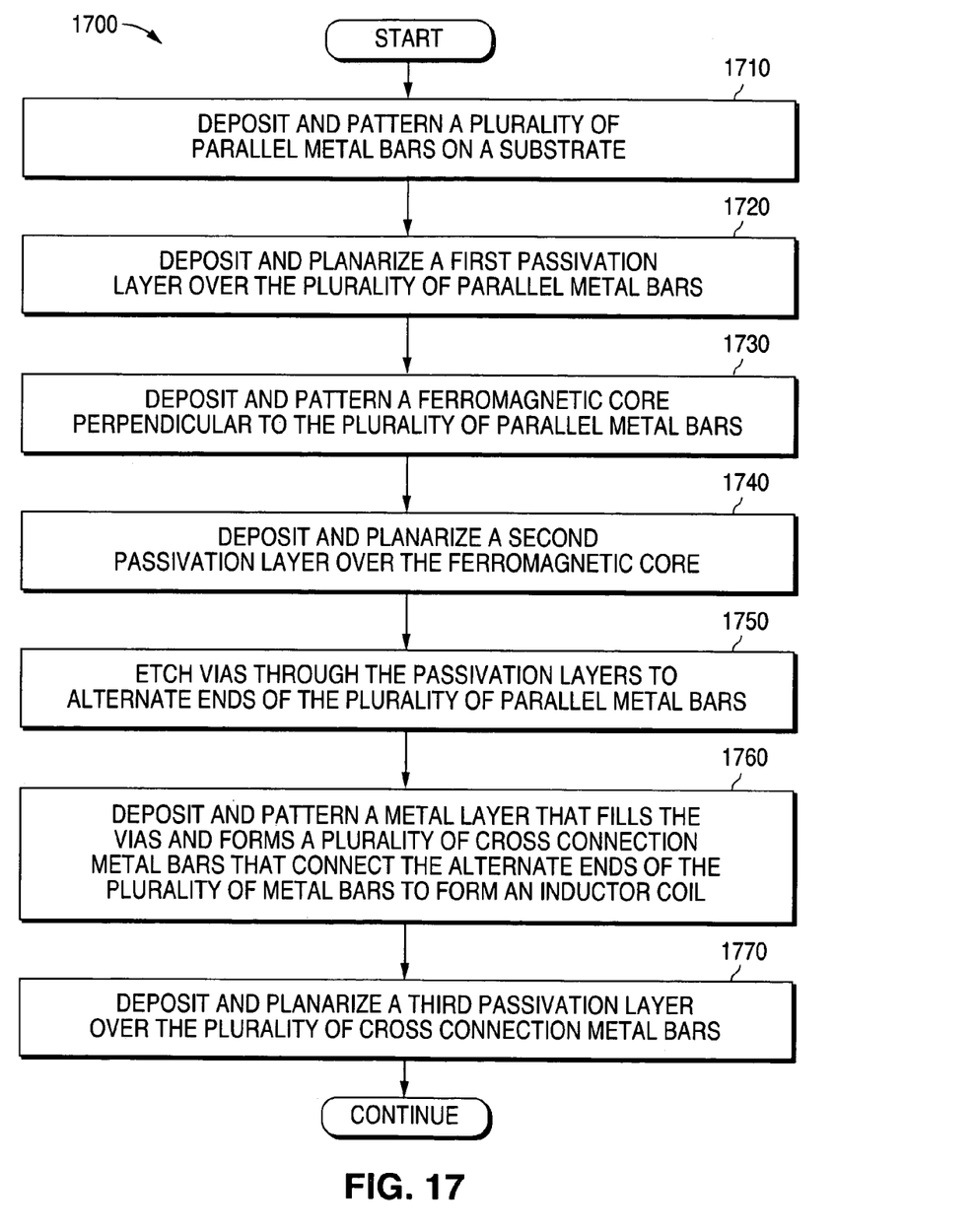
FIG. 17 illustrates a flow chart showing the steps of an advantageous embodiment of the method of the present invention.

FIG. 17 illustrates a flow chart 1700 showing the steps of an advantageous embodiment of the method of the present invention. The method of the present invention begins by providing a substrate (or other suitable surface) within an integrated circuit that is being manufactured. A plurality of parallel metal bars are deposited and patterned on the substrate (step 1710). Then a first passivation layer is deposited and planarized over the plurality of parallel metal bars (step 1720).

Then a ferromagnetic core is deposited and patterned so that its length is perpendicular to the plurality of parallel metal bars (step 1730). Then a second passivation layer is deposited and planarized over the ferromagnetic core (step 1740). Vias are then etched through the passivation layers to alternate ends of the plurality of parallel metal bars (step 1750).

Then a metal layer is deposited and patterned that fills the vias and forms a plurality of cross connection metal bars that connect the ends of the plurality of metal bars to form an inductor coil (step 1760). Then a third passivation layer is deposited and planarized over the plurality of cross connection metal layers (step 1770). The steps of this advantageous embodiment of the method of the present invention create an out of plane inductor coil within an integrated circuit. The number of turns to be created in the inductor coil is a design parameter.

In the advantageous embodiments of the invention that have been described above the underlying plurality of metal bars have been formed so that they are parallel with respect to each other. Similarly, the plurality of cross connection metal bars has been formed so that they are parallel with respect to each other. The use of parallel metal bars represents a best mode of practicing the invention. It is understood, however, that the inductor coil of the present invention may also be manufactured with metal bars that are not strictly parallel with respect to each other.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing an out of plane integrated circuit inductor, said method comprising the steps of:
   providing a substrate;
   creating a plurality of metal bars on said substrate;
   depositing a first passivation layer over said plurality of metal bars and over said substrate;

etching vias through said first passivation layer to alternate ends of the plurality of metal bars; and creating on said first passivation layer a plurality of cross connection metal bars having vertical portions that fill said vias and that connect said alternate ends of said plurality of metal bars to form said integrated circuit inductor;

wherein the first passivation layer is self-planarizing and has a thickness that is approximately one-half of a thickness of one or more coils formed by the metal bars, the vias and the cross connection metal bars.

2. The method as set forth in claim 1 further comprising the step of:

depositing a second passivation layer over said plurality of cross connection metal bars and over said first passivation layer.

3. The method as set forth in claim 1 wherein each of said plurality of metal bars is parallel with respect to each other of said plurality of metal bars.

4. The method as set forth in claim 1 wherein each of said plurality of cross connection metal bars is parallel with respect to each other of said plurality of cross connection metal bars.

5. The method as set forth in claim 1 wherein said plurality of metal bars are made of at least one of: copper and aluminum.

6. An out of plane integrated circuit inductor comprising:
a plurality of metal bars on a substrate;
a first passivation layer deposited over said plurality of metal bars and over said substrate;
a plurality of vias etched through said first passivation layer to alternate ends of the plurality of metal bars; and
a plurality of cross connection metal bars on said first passivation layer, said plurality of cross connection metal bars having vertical portions that fill said vias and that connect said alternate ends of said plurality of metal bars to form said integrated circuit inductor;
wherein the first passivation layer is self-planarizing and has a thickness that is approximately one-half of a thickness of one or more coils formed by the metal bars, the vias, and the cross connection metal bars.

7. The out of plane integrated circuit inductor as set forth in claim 6 further comprising a second passivation layer over said plurality of cross connection metal bars and over said first passivation layer.

8. The out of plane integrated circuit inductor as set forth in claim 6 wherein each of said plurality of metal bars is parallel with respect to each other of said plurality of metal bars.

9. The out of plane integrated circuit inductor as set forth in claim 7 wherein each of said plurality of cross connection metal bars is parallel with respect to each other of said plurality of cross connection metal bars.

10. The out of plane integrated circuit inductor as set forth in claim 7 wherein said plurality of metal bars are made of at least one of: copper and aluminum.

11. The out of plane integrated circuit inductor as set forth in claim 7 wherein said substrate comprises a portion of an integrated circuit that contains circuit elements.

12. The out of plane integrated circuit inductor as set forth in claim 7, wherein the first passivation layer comprises benzo-cyclobutene (BCB).

13. The method as set forth in claim 1, wherein the first passivation layer comprises benzo-cyclobutene (BCB).

14. An integrated circuit, comprising:
a substrate; and
a plurality of circuit elements formed on the substrate, the circuit elements including an out of plane inductor that comprises:
a first plurality of metal bars;
a first passivation layer deposited over the first plurality of metal bars;
a plurality of vias etched through the first passivation layer to alternate ends of the first plurality of metal bars; and
a second plurality of metal bars on the first passivation layer, the second plurality of metal bars having portions that fill the vias and connecting the alternate ends of the first plurality of metal bars;
wherein the first passivation layer is self-planarizing and has a thickness that is approximately one-half of a thickness of one or more coils formed by the first plurality of metal bars, the vias, and the second plurality of metal bars.

15. The integrated circuit as set forth in claim 14, wherein the out of plane inductor further comprises:
a second passivation layer over the second plurality of metal bars and the first passivation layer.

16. The integrated circuit as set forth in claim 14, wherein the first plurality of metal bars are parallel with respect to each other.

17. The integrated circuit as set forth in claim 14, wherein the second plurality of metal bars are parallel with respect to each other.

18. The integrated circuit as set forth in claim 14, wherein the first and second plurality of metal bars are made of at least one of: copper and aluminum.

19. The integrated circuit as set forth in claim 14, wherein the first passivation layer comprises benzo-cyclobutene (BCB).

20. The integrated circuit as set forth in claim 14, wherein the out of plane inductor further comprises:
a plurality of second vias etched through the first passivation layer to ends of two of the first plurality of metal bars; and
metal contacts formed in the second vias for coupling the out of plane inductor to at least one other circuit element.

* * * * *